US006546516B1

(12) United States Patent
Wright et al.

(10) Patent No.: US 6,546,516 B1
(45) Date of Patent: Apr. 8, 2003

(54) METHOD AND APPARATUS FOR MEASURING TIMING CHARACTERISTICS OF MESSAGE-ORIENTED TRANSPORTS

(75) Inventors: James L. Wright, Chappaqua, NY (US); Eli U. Brandt, Pittsburg, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/444,399

(22) Filed: Nov. 22, 1999

(51) Int. Cl.[7] .......................... H03M 13/00; G06F 5/00

(52) U.S. Cl. .......................... 714/762; 714/712; 710/60

(58) Field of Search ................................ 714/712–717, 714/55–57, 761, 762, 786–788; 710/58–61; 709/232–235; 700/306; 348/180, 184, 192; 375/224–228; 84/645

(56) References Cited

U.S. PATENT DOCUMENTS

| | | | | | |
|---|---|---|---|---|---|
| 4,855,969 | A | * | 8/1989 | Mydill | 368/120 |
| 5,392,224 | A | * | 2/1995 | Badia et al. | 714/715 |
| 5,619,733 | A | * | 4/1997 | Noe et al. | 710/61 |
| 5,832,309 | A | * | 11/1998 | Noe et al. | 710/61 |
| 6,249,891 | B1 | * | 6/2001 | Matsumura et al. | 714/738 |
| 6,405,147 | B1 | * | 6/2002 | Fera | 702/112 |
| 6,407,769 | B1 | * | 6/2002 | Emmett | 348/180 |

* cited by examiner

*Primary Examiner*—Maria N. Von Buhr
(74) *Attorney, Agent, or Firm*—Whitham, Curtis & Christofferson, P.C.; Stephen C. Kaufman

(57) ABSTRACT

Timing characteristics of message-oriented transports are measured using common personal computers which easily support a wide variety of analytical tools. The apparatus measures timing characteristics of bursty message traffic over relatively low-speed digital transports such as the Musical Instrument Digital Interface (MIDI). The apparatus includes means for generating a reference pulse stream, such as a sequencer. A transcoder device receives the reference pulse stream and routes the pulse stream to a device under test and, in analog form, to a first channel input of a digital recording device, such as a sound card installed in a personal computer. The transcoder also receives an output pulse stream from the device under test and routes the output pulse stream, in analog form, to a second channel input of the digital recording device. A differential technique allows timing errors in the reference pulse stream to be eliminated from measurements. The apparatus can also be used for measuring propagation characteristics of a particular transmission medium.

14 Claims, 4 Drawing Sheets

METHOD AND APPARATUS FOR MEASURING TIMING CHARACTERISTICS OF MESSAGE-ORIENTED TRANSPORTS

BACKGROUND OF THE INVENTION

1. Field of the Invention

The present invention generally relates to a method and apparatus for measuring timing characteristics of low to moderate rate bursty message traffic over a digital transport. "Bursty" is a term used to describe information that flows unevenly, intermittently or asynchronously, with intense periods of activity followed by relatively long, silent intervals typically of varying length.

2. Background Description

Various methods and apparatuses have been used for measuring pulse streams over various transports. These include logic analyzers of different kinds and microprocessor-based test devices. Logic analyzers are very expensive. Since they are relative complex, general purpose devices, significant work and expertise is needed to conduct timing tests using a logic analyzer. Furthermore, captured data may not be in a format conducive to further analysis using common personal computers. Microprocessor-based devices are also very expensive and, in some cases, lack facilities for transferring captured data to a personal computer for further analysis.

In an unrelated technology, the specifications for the Musical Instrument Digital Interface, or MIDI for short, were established in the time period between 1981 and 1983 by a group of electronic musical instrument manufacturers. Since that time, the specification has been augmented from time to time. Basically, MIDI is a software and hardware specification by which musical data is transferred among hardware devices, allowing keyboards to "talk" to computers, synthesizers and other digital music devices. The source of the MIDI standard is "The Complete MIDI 1.0 Detailed Specification", Version 96.1, MIDI Manufacturers Association, March 1996.

Since a MIDI data stream is a serial data stream, a personal computer can receive the data, note the time the data was received and then store both these quantities into memory or onto disk. This data can be manipulated by suitable software, and the computer can play back the data to a synthesizer via a MIDI connection. This type of program is called a sequencer.

SUMMARY OF THE INVENTION

It is therefore an object of the present invention to provide an inexpensive solution to the problem of measuring timing characteristics of message-oriented transports, using common personal computers which easily support a wide variety of analytical tools.

It is another object of the invention to provide a way of measuring timing characteristics of message-oriented transports that requires little expertise to conduct tests.

It is a further object of the invention to measure timing errors resulting from less than perfect transmission of low-speed MIDI data over high-speed transports.

According to the invention, there is provided a means of accurately measuring timing characteristics of bursty message traffic over relatively low to moderate rate digital transports such as the Musical Instrument Digital Interface (MIDI). The apparatus includes means for generating a reference pulse stream, such as a sequencer. A transcoder device receives the reference pulse stream and routs the pulse stream to a device under test and, in analog form, to a first channel input of a digital recording device, such as a sound card installed in a personal computer. The transcoder also receives an output pulse stream from the device under test and routes the output pulse stream, in analog form, to a second channel input of the digital recording device. The invention provides the following advantages:

- Low hardware cost,
- Highly accurate timing measurements,
- Differential technique that allows timing errors in the reference pulse stream to be eliminated from measurements, and
- Easily supports a broad variety of analysis techniques using common software on personal computers.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
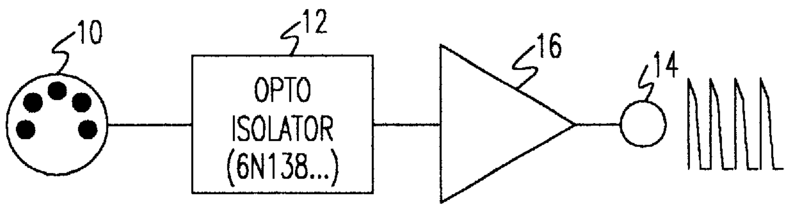
FIG. 1 is a block diagram showing the connection of the output of a MIDI IN opto-isolator to the input of a typical personal computer sound card.

Referring now to the drawings, and more particularly to FIG. 1, there is shown a block diagram of the MIDI transducer. The basic concept is to process a MIDI message stream directly as a digital audio stream (typically using a 44.1K sample rate with 8 or 16-bit precision as desired). FIG. 1 shows how this can be done with minimal special hardware. MIDI connector 10, a standard DIN 5-pin connector, functions as a MIDI-IN connector and is connected to an opto-isolator 12, the output of which can be connected directly to one of the audio input connectors 14 of most personal computer sound cards. As is typical of serial connectors, only two pins of the MIDI connector 10 are used for signal lines. The opto-isolator 12 may include a universal asynchronous receiver/transmitter (UART) and other hardware needed to perform the intended functions. A buffer amplifier 16 may be optionally inserted between the opto-isolator 12 and the sound card input connector 14. The opto-isolator output is treated as an analog signal, buffered to provide appropriate voltage swing and source impedance, and then applied to an audio sound card or other audio capture and/or recording device.

With this connection, the timing characteristics of the pulse stream are measured by analyzing the incoming audio stream or recorded audio file. This works because the MIDI standard is essentially an asymmetrical pulse train with a base frequency of about 15.5 KHz, well under the typical 22 KHz digital audio bandwidth, and common personal computers include a digital audio capture and recording function with audio inter-channel timing skew of significantly less than one audio sample period (<<23 microseconds), more than enough for measuring MIDI performance characteristics. The audio stream or recorded audio file is then analyzed to obtain the timing characteristics of the original MIDI pulse stream. Measurement accuracy is better than 50 microseconds. The basic approach is similar to an earlier approach described by A. Freed, A. Chaudhary and B. Davila in "Operating Systems Latency Measurement and Analysis for Sound Synthesis and processing Applications", *ICMC*, Thessaloniki, Greece (1997). This paper is available via the Internet at <http://cnmat.cnmat.berkeley.edu/ICMC97/papers-html/Latency.html>.

Figure 2:
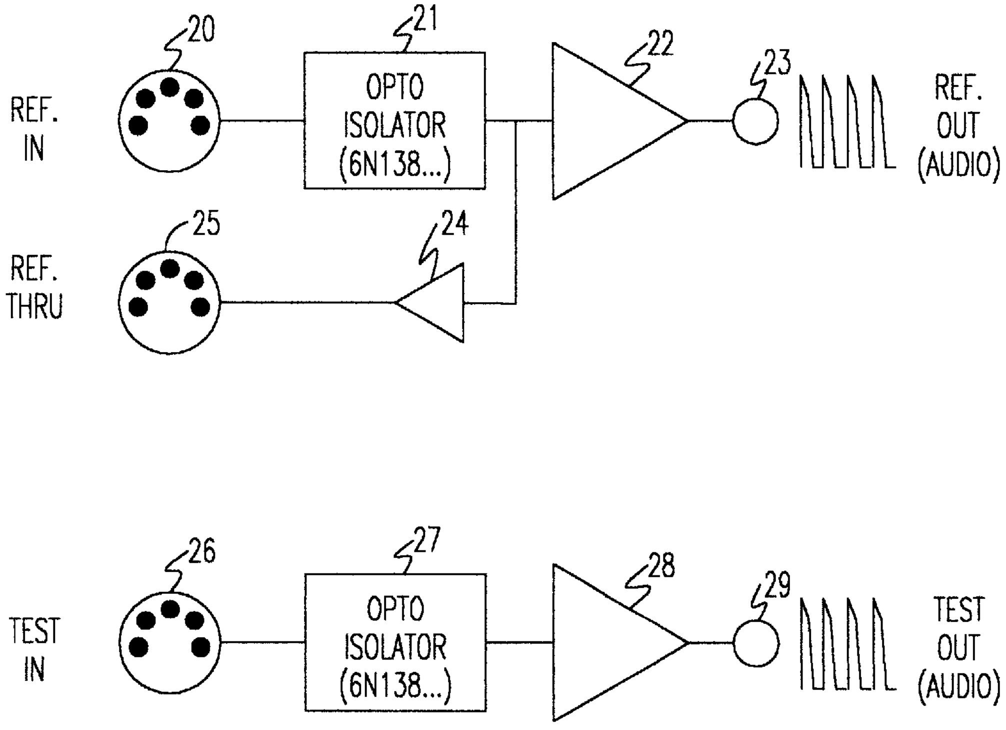
FIG. 2 is a block diagram showing the connections of a MIDI-wave trascoder in the practice of the invention.

FIG. 2 shows the differential test device according to the present invention. A reference MIDI pulse stream is generated by a sequencer or other device and applied to the REF MIDI IN input connector 20. It is possible, for example, to use a personal computer as the sequencer to generate the reference MIDI pulse stream. This MIDI pulse stream is passed by the opto-isolator 21 to a first buffer amplifier 22, having its output connected to the personal computer sound card left channel input connector 23, and to a second buffer amplifier 24, having its output connected to the REF MIDI THRU output connector 25. The REF MIDI THRU output is a digital copy of the REF MIDI IN signal (typically delayed by less than 2 microseconds). The REF MIDI OUT audio input at connector 23 is a buffered analog copy of the reference MIDI pulse stream. A MIDI pulse stream generated by a device under test is applied to the TEST MIDI IN input connector 26 and passed by opto-isolator 27 to buffer amplifier 28 sound card right channel input connector 29. The TEST OUT audio output is a buffered analog copy of the test MIDI pulse stream. The amplitude of both audio signals is appropriate for line-level audio inputs on typical personal computers.

Figure 3:
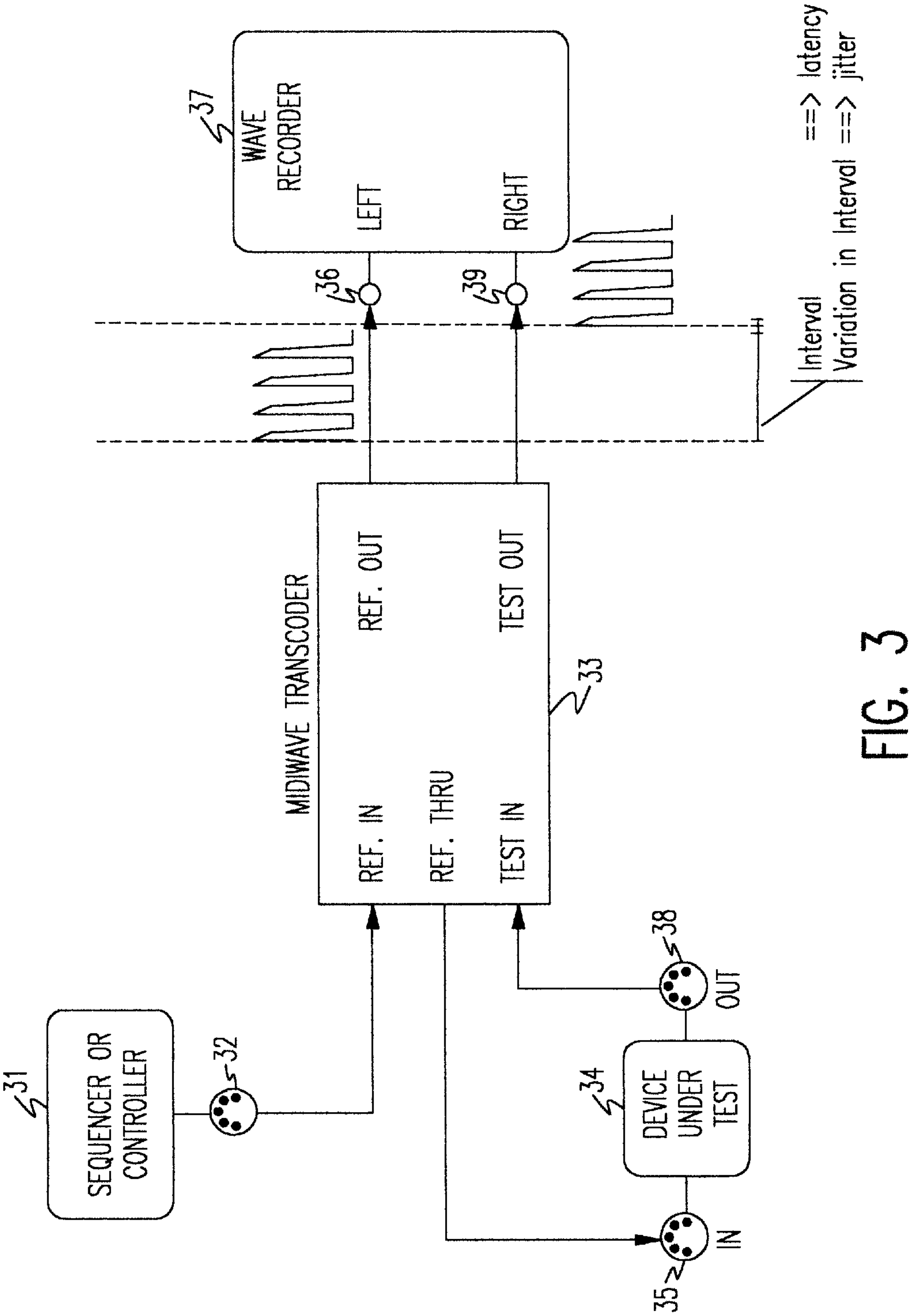
FIG. 3 is a block diagram showing basic test configuration using the MIDI-wave transcoder of FIG. 2 in the practice of the invention.

FIG. 3 shows the typical test configuration. The reference MIDI pulse stream from a sequencer 31 or other device is applied via MIDI connector 32 to the REF IN input of the MIDI-wave transcoder 33 (shown in FIG. 2) and routed to both the device under test 34, via the REF THRU output of the transcoder 33 and MIDI connector 35, and, in analog form via the REF OUT output of the transcoder 33, to the left audio input channel connector 36 of a sound card 37 or other digital audio recording or capture device installed in a personal computer. The MIDI output of the device under test 34 is applied to the TEST IN input of the transcoder 33 via MIDI connector 38, and the corresponding analog output is applied to the right audio input connector 39 of the same sound card 37 or other recording device via the TEST OUT output of the transcoder 33.

By differentially comparing the left channel audio (reference source) to the right channel audio (system under test), the timing errors introduced by the system under test are measured while at the same time essentially eliminating any timing irregularities in the reference pulse stream from the measurements. The interval between left and right channel pulses corresponds to latency, while the variation in the interval over time corresponds to jitter. Since left and right channels in an audio stream are phase coherent, timing skew between the two channels is less than one sample time (normally less than 23 microseconds at 44.1 KHz sample rate). This is well below the target measurement accuracy of 100–200 microseconds.

Figure 4:
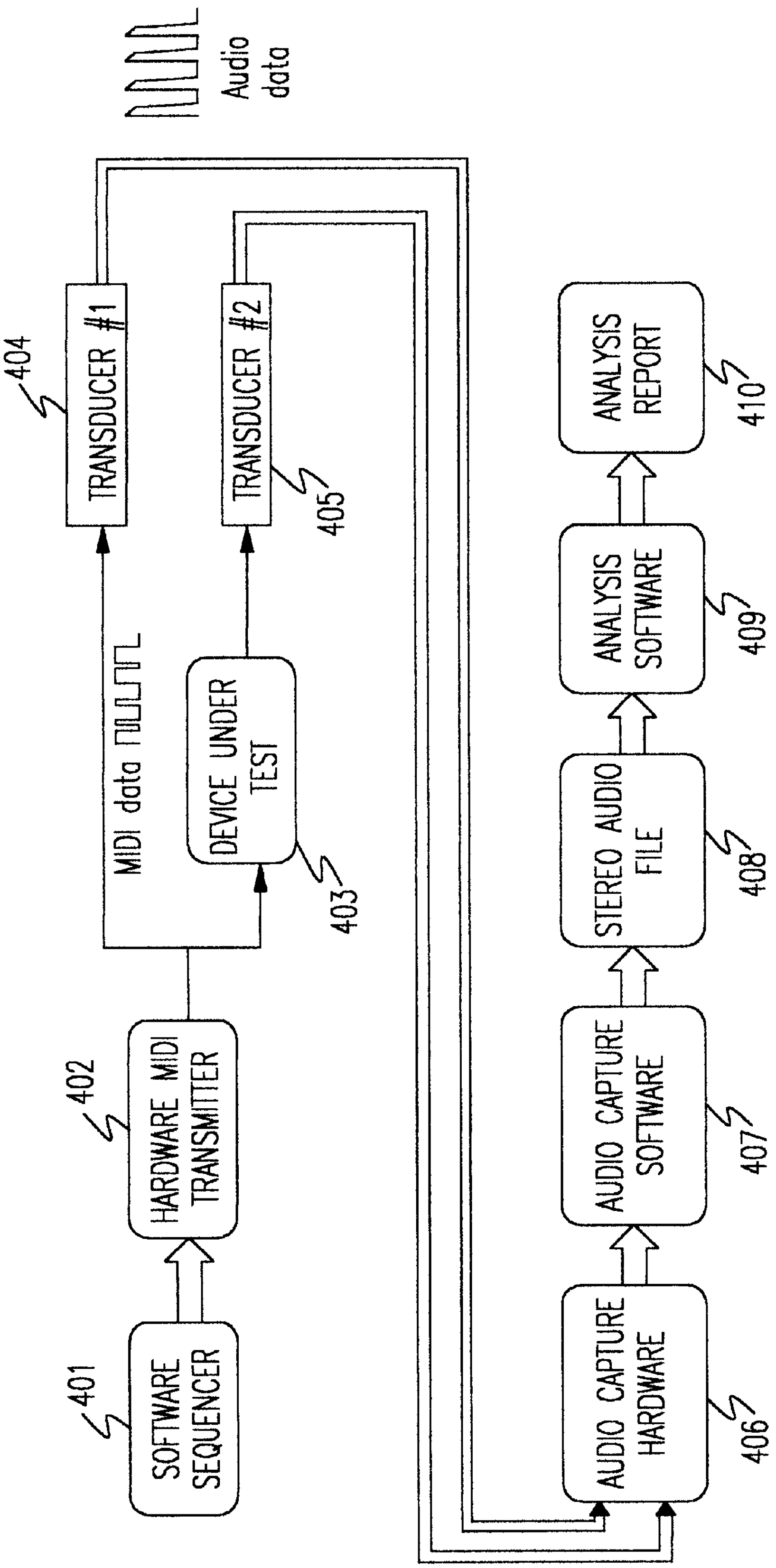
FIG. 4 is a flow diagram of the process for signal capture and analysis.

A flow diagram for signal capture and analysis is shown in FIG. 4. A software sequencer 401 is used to control generation of the reference MIDI event stream by a hardware MIDI transmitter 402 (which is typically part of a computer sound card). The reference MIDI event stream is applied both to the device under test 403 and directly to transducer number one 404. The MIDI test output event stream generated by the device under test 403 is applied to transducer number two 405. Each transducer converts an incoming MIDI event stream into an audio waveform. This is accomplished by converting the current pulses used for transmitting digital MIDI data into a voltage signal using an opto-isolator, and then buffering the voltage signal output by the opto-isolator to provide a signal suitable for subsequent audio capture. The outputs of each of transducers 404 and 405 are applied to the appropriate input (i.e., left or right) of the stereo audio capture hardware 406 (which is typically part of a computer sound card or implemented as part of the computer motherboard circuitry). Audio capture software 407 is used in conjunction with the audio capture hardware 406 to generate a two-channel audio file 408 containing the transduced reference event stream in one audio channel and the transduced test output event stream in the other audio channel. Audio capture software is commonly included with consumer operating systems (e.g., Sound Recorder application bundled with Microsoft Windows operating system) and is also provided as part of many MIDI/Audio Sequencer applications. The two-channel audio file 408 is then analyzed at a later time by the analysis software 409 in order to produce an analysis report 410 which describes latency and jitter characteristics of the test output event stream and other timing and test information as may be appropriate.

The audio file 408 is optional in the embodiment shown in FIG. 4. It is also possible to connect the audio capture software 407 directly to the analysis software 409, avoiding the need for the intermediate audio file. Omission of the audio file 408 has several benefits: (1) Analysis can be performed in close to real-time (permitting dynamic reporting of timing characteristics, which may change as aspects or parameters of the device, medium or transport under test are varied. (2) The intermediate audio file may be inconveniently large (e.g., 320 to 640 megabytes for a one-hour test run). Omission of the audio file 408 has at least one drawback, and that is one can no longer view the actual captured data along with the event markers, one can only view the logged markers (time stamps) themselves.

Each transduced MIDI event is recorded as a cluster of closely spaced audio pulses ("event cluster"). The minimum interval between a pair of successive event clusters is significantly larger than the maximum interval between two successive pulses within a given event cluster. The analysis software 409 incorporates standard audio peak detection algorithms to generate a time-stamped marker corresponding to the onset of each recorded event cluster. The attack and decay characteristics of the peak detection algorithm used should be selected such that the beginning of a given event cluster causes the peak detector to generate the marker, but successive pulses within the same event cluster do not generate an additional marker. Both the reference and test output audio event streams are marked in this manner. Other portions of the analysis software 409 then compare the two marked event streams in order to determine the latency (delay) between corresponding marked events within the two streams, the jitter (variation in inter-event timing) within both the reference and test output streams, and the additional jitter present in the marked test output stream (obtained by subtracting the jitter calculated for sets of events in the reference stream from the jitter calculated for corresponding sets of events in the test output stream).

Measurement of jitter within the reference stream itself is optional. Jitter of the test stream can be determined by calculating the difference between the onset of a given TEST event and the onset of the corresponding REF event and then subtracting the calculated latency value. The residual amount is the TEST stream jitter for that particular event. In this case, the inherent REF steam jitter is never determined. It is necessary to update the latency value periodically. Latency is the average delay between the REF and corresponding TEST events, calculated as a moving average over time.

Figure 5:
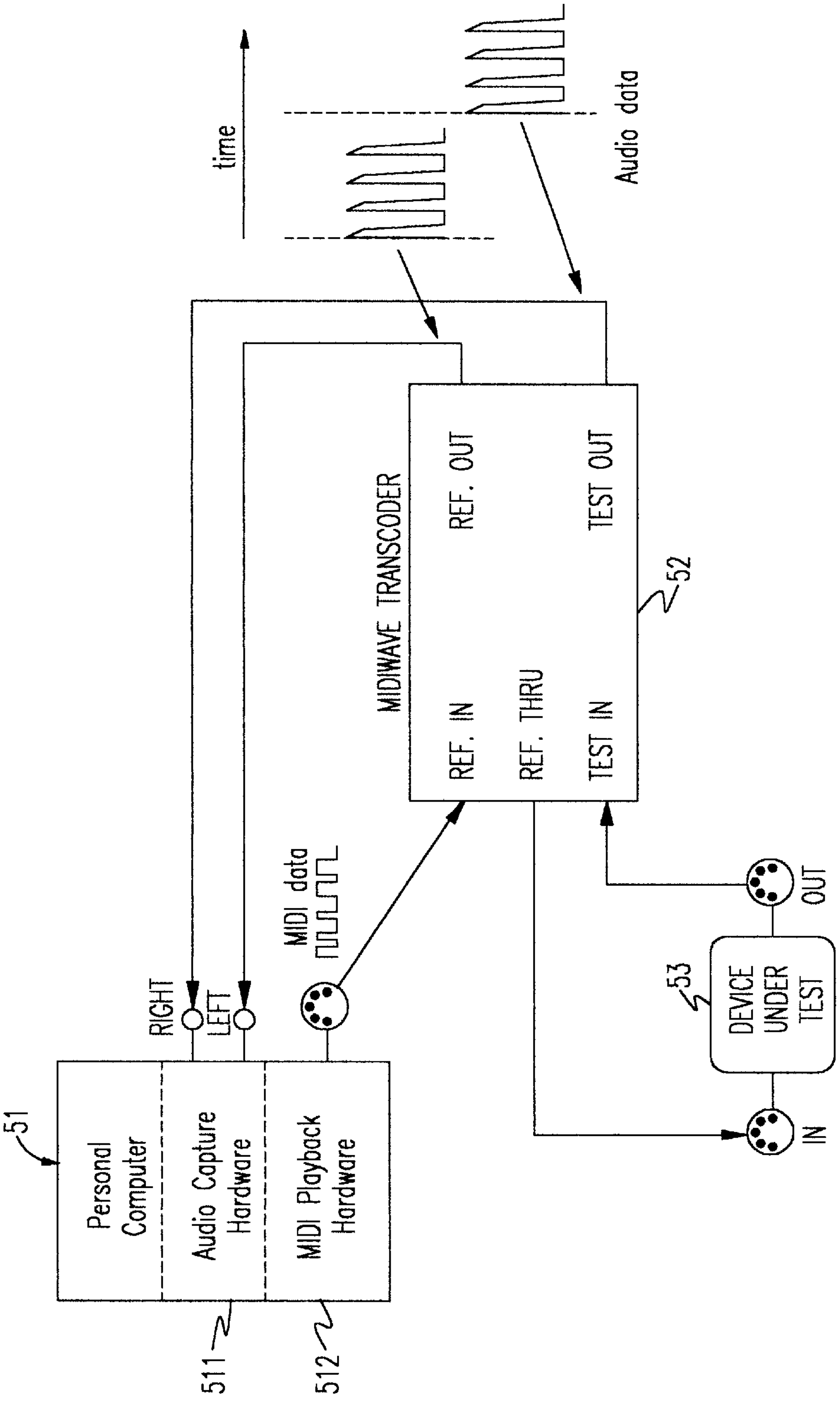
FIG. 5 is a block diagram illustrating a measurement system using a single personal computer.

FIG. 5 shows a typical test setup using a personal computer (PC). The PC 51 is configured to include an audio capture board 511 and MIDI playback hardware 512, both commercially available components and both supported by appropriate software running on the PC. The MIDI-wave transcoder (FIG. 2) receives MIDI data from the MIDI playback hardware 512 as the REF IN signal. This MIDI data is output from the REF THRU output of the MIDI-wave transcoder 52 to the device under test 53, and the output of the device under test is input at the TEST IN input of the MIDI-wave transcoder 52. In the example shown in FIG. 5, the REF OUT signal from the MIDI-wave transcoder 52 is connected to the left channel input of the audio capture board 511, while the TEST OUT signal is connected to the right channel input of the audio capture board 511. These connections could be reversed as the order of channels is unimportant to the practice of the invention. The MIDI playback hardware 512 generates the MIDI reference event stream, and the audio capture board 511 captures the resulting audio data from the MIDI-wave transcoder. The analysis software 409 (FIG. 4) runs on the PC 51 to generate the analysis report.

Examples of the types of devices that could be tested using the invention include the following:

a) MIDI interface devices connected to a personal computer via serial or parallel port, PCI bus or similar means. The "device under test" in this case would comprise two such MIDI interface devices and the associated computer. The invention would be used for testing the combined system performance of the devices and associated computer.

b) MIDI interface devices connected to a data or media transport such as USB (Universal Serial Bus) or IEEE-1394 (sometimes referred to as "firewire"). Such devices are currently on the market (for USB) or in development (IEEE-1394). The "device under test" in this case would comprise two such MIDI interface devices and the associated data or media transport. For USB, a host computer would also be involved. The invention would be used for testing the combined system performance of the devices.

c) A MIDI processing device which modifies one or more incoming MIDI data streams in some manner. The invention would be used to test the performance of the individual device.

d) A MIDI synthesizer or other MIDI-controlled sound generating device. In this case, one audio channel would capture the transcoded MIDI stream, while the second channel would capture the actual sound generated by the device under test. Modified software (and possibly manual annotation) would be required to correlate the triggering MIDI events with the corresponding specific sounds generated by the device under test.

e) A computer (with MIDI interface per a) and b) above), music keyboard controller or other MIDI controller device generating MIDI data. In this case, the differential timing analysis central to the preferred embodiment of the invention would not be performed. Instead, the inherent timing accuracy of the source device would be measured, without comparison to a reference pulse stream. While not the preferred embodiment, this application provides useful information and would typically be performed in all of the above scenarios in order to determine the timing characteristics of the source data stream as well as those of the actual device under test.

Generally, any kind of device which transports data that has time-critical delivery aspects could potentially be tested using the invention. The basic idea is to capture both a reference data stream and a duplicated or derived data stream, and measure the timing differences between the two in order to determine the timing errors contributed during processing of the reference data stream. The recording device, which captures the two data streams, needs sufficient resolution to capture each data stream accurately. With an appropriate transducer, the audio recorder and software described could capture and analyze control events for mechanical or electrical systems, potentially including lighting, stage and pyrotechnic equipment, robots and industrial machinery.

The invention could also be used for measuring propagation characteristics of a particular solid or viscous transmission medium (e.g., plastic, organic tissue, ceramic, etc.), as well as timing characteristics of bursty message traffic. For example, the invention could be applied in the field of vibration measurement. Assume that one wishes to measure the dynamic propagation characteristics of a piece of physical material of some kind. The invention could be used to capture both a pulse train transduced from a physical stimulus, e.g., a solenoid or other device striking the material under test, and a separate pulse train transduced from a different location on the same piece of material. A differential technique could be used to determine latency and jitter characteristics of impulse propagation through the material.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. Apparatus for measuring timing characteristics of bursty message traffic over a low to moderate rate digital transport or transmission medium comprising:

means for generating a reference pulse stream;

a transcoder device receiving said reference pulse stream and routing the pulse stream to a device or transmission medium under test and, in analog form, to a first channel input of a multichannel analog-to-digital capture an/or recording device, the transcoder further receiving an output pulse stream from the device or transmission medium under test and routing the output pulse stream, in analog form, to a second channel input of the analog-to-digital capture and/or recording device; and means for processing and analyzing captured pulse streams so as to measure one or more timing characteristics of the output pulse stream from the device or transmission medium under test.

2. The apparatus recited in claim 1, wherein the analog-to-digital capture and/or recording device is installed in a personal computer.

3. The apparatus recited in claim 2, wherein the analog-to-digital capture and/or recording device is a sound card installed in the personal computer and the first and second channel inputs are first and second audio inputs of the sound card.

4. The apparatus recited in claim 1, wherein the low to moderate rate digital transport is a Musical Instrument Digital Interface (MIDI).

5. The apparatus recited in claim 4, wherein the means for generating a reference pulse stream is a sequencer.

6. The apparatus recited in claim 5, wherein the sequencer is installed in a personal computer.

7. The apparatus recited in claim 6, wherein the sequencer comprises a combination of software and hardware to generate MIDI data.

8. The apparatus recited in claim 7, wherein the analog-to-digital capture and/or recording device is installed in the personal computer.

9. The apparatus recited in claim 8, wherein the analog-to-digital capture and/or recording device is a sound card installed in the personal computer and the first and second channel inputs are first and second audio inputs of the sound card.

10. A method for process signal capture and analysis, comprising the steps of:

generating a reference pulse stream;

receiving said reference pulse stream and routing the pulse stream to a device or transmission medium under test and, in analog form, to a first channel input of a multichannel analog-to-digital capture and/or recording device; and receiving an output pulse stream from the device or transmission medium under test and routing the output pulse stream, in analog form, to a second channel input of the analog-to-digital capture and/or recording device.

11. The method recited in claim 10, further comprising the steps of:

detecting peaks in the captured or recorded reference pulse stream;

detecting peaks in the captured or recorded output pulse stream from the device or medium under test; and analyzing timing differences between the detected peaks in the captured or recorded reference pulse stream and the captured or recorded output pulse stream from the device or medium under test.

12. The method recited in claim 11, further comprising the step of generating an analysis report based on the analyzing step.

13. A method for measuring timing characteristics of bursty message traffic over a low or moderate rate digital transport or transmission medium comprising the steps of:

generating a Musical Instrument Digital Interface (MIDI) reference event stream;

receiving said MIDI reference event stream and routing the MIDI reference event stream to a device or medium under test;

receiving an output MIDI event stream from the device or medium under test;

capturing the received MIDI reference event stream in analog form;

capturing the received output MIDI event stream from the device or medium under test in analog form;

detecting peaks in the captured MIDI reference event stream;

detecting peaks in the captured output MIDI event stream; and analyzing timing differences between the detected peaks in the captured MIDI reference event stream and the received output MIDI event stream.

14. The method recited in claim 13, wherein the MIDI reference event stream is generated by a MIDI sequencer.

* * * * *